(12) United States Patent
Eromaki (10) Patent No.: US 10,165,162 B2
(45) Date of Patent: Dec. 25, 2018

(54) ELECTROMAGNETIC CAMERA DEVICE

(71) Applicant: Microsoft Technology Licensing, LLC, Redmond, WA (US)

(72) Inventor: Marko Eromaki, Tampere (FI)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 10 days.

(21) Appl. No.: 15/194,454

(22) Filed: Jun. 27, 2016

(65) Prior Publication Data
US 2017/0374248 A1    Dec. 28, 2017

(51) Int. Cl.
| | |
|---|---|
| *H04N 5/225* | (2006.01) |
| *H05K 1/14* | (2006.01) |
| *H05K 1/16* | (2006.01) |
| *H05K 1/18* | (2006.01) |

(52) U.S. Cl.
CPC ......... *H04N 5/2253* (2013.01); *H04N 5/2254* (2013.01); *H04N 5/2257* (2013.01); *H05K 1/14* (2013.01); *H05K 1/181* (2013.01); *H05K 1/165* (2013.01); *H05K 2201/10121* (2013.01); *H05K 2201/10151* (2013.01)

(58) Field of Classification Search
CPC .. H04N 5/2253; H04N 5/2254; H04N 5/2257; G02B 7/09; G02B 27/646
See application file for complete search history.

(56) References Cited

U.S. PATENT DOCUMENTS

| | | | |
|---|---|---|---|
| 5,557,152 A | | 9/1996 | Gauthier |
| 5,912,774 A | * | 6/1999 | Yoshida ............... G02B 7/36 359/823 |
| 6,255,749 B1 | | 7/2001 | Aoshima et al. |
| 7,443,439 B2 | | 10/2008 | Kim et al. |
| 7,477,315 B2 | | 1/2009 | Shin |
| 7,586,701 B2 | | 9/2009 | Kim et al. |
| 7,747,162 B2 | | 6/2010 | Kim |

(Continued)

FOREIGN PATENT DOCUMENTS

| | | |
|---|---|---|
| CN | 2899315 Y | 5/2007 |
| CN | 201821392 U | 5/2011 |

(Continued)

OTHER PUBLICATIONS

Wong, A., "A New Honor Smart Phone Appears with a Pop up Camera Module", Soyacincau website, http://www.soyacincau.com/2015/08/04/a-new-honor-smart-phone-appears-with-a-pop-up-camera-module/, Aug. 4, 2015, 3 pages.

(Continued)

*Primary Examiner* — Daniel M Pasiewicz
(74) *Attorney, Agent, or Firm* — Alleman Hall Creasman & Tuttle LLP (57) ABSTRACT

Examples are disclosed herein that relate to linear magnetic actuators in camera devices. One example provides a camera device comprising an optical sensor, a lens positioned a variable distance away from the optical sensor, a linear magnetic actuator having a coil and a magnet configured for linear relative movement upon driving of current, and an actuator coupling structure. The actuator coupling structure couples the linear magnetic actuator to the lens, such that the lens moves in response to the movement of the linear actuator.

20 Claims, 5 Drawing Sheets

(56) References Cited

U.S. PATENT DOCUMENTS

| | | | |
|---|---|---|---|
| 8,131,147 B2 | 3/2012 | Kusatsugu | |
| 8,730,599 B2 | 5/2014 | Topliss | |
| 8,731,390 B2 * | 5/2014 | Goldenberg | G03B 3/10 |
| | | | 335/219 |
| 9,105,550 B2 | 8/2015 | Rhoads | |
| 9,448,382 B2 * | 9/2016 | Avivi | G03B 3/10 |
| 2006/0153559 A1 | 7/2006 | Kim | |
| 2006/0170814 A1 * | 8/2006 | Tsai | G02B 7/023 |
| | | | 348/357 |
| 2007/0216803 A1 | 9/2007 | Eromaki | |
| 2008/0074528 A1 * | 3/2008 | Westerweck | G02B 7/102 |
| | | | 348/311 |
| 2008/0106811 A1 * | 5/2008 | Eromaki | G02B 7/102 |
| | | | 359/817 |
| 2009/0034094 A1 * | 2/2009 | Noda | F03G 7/065 |
| | | | 359/694 |
| 2009/0091832 A1 * | 4/2009 | Nagai | G02B 27/646 |
| | | | 359/557 |
| 2009/0252488 A1 | 10/2009 | Eromaki et al. | |
| 2010/0060774 A1 * | 3/2010 | Azuma | G02B 7/025 |
| | | | 348/335 |
| 2010/0091122 A1 * | 4/2010 | Irisawa | H04N 5/2253 |
| | | | 348/208.7 |
| 2010/0232042 A1 | 9/2010 | Terajima | |
| 2011/0045877 A1 | 2/2011 | Ahn et al. | |
| 2013/0314587 A1 | 11/2013 | Kriman et al. | |
| 2014/0028887 A1 * | 1/2014 | Azuma | G03B 13/36 |
| | | | 348/333.01 |
| 2014/0354814 A1 | 12/2014 | Han et al. | |
| 2015/0373252 A1 * | 12/2015 | Georgiev | H04N 5/2259 |
| | | | 348/349 |
| 2016/0070115 A1 | 3/2016 | Miller et al. | |
| 2016/0330365 A1 * | 11/2016 | Maruyama | H04N 5/23212 |
| 2017/0230552 A1 * | 8/2017 | Eromaki | H04N 5/2254 |

FOREIGN PATENT DOCUMENTS

| | | |
|---|---|---|
| KR | 20050014496 A | 2/2005 |
| KR | 100620697 B1 | 9/2006 |
| WO | 2015025878 A1 | 2/2015 |

OTHER PUBLICATIONS

"UTAF™ (Ultra-Thin Autofocus) modules", Published on: Jan. 5, 2013 Available at: http://www.newscaletech.com/applications/phone-cameras.php.

"Galaxy S4 zoom", Published on: Jun. 25, 2013 Available at: http://www.samsung.com/global/microsite/galaxycamera/s4zoom/.

* cited by examiner

ELECTROMAGNETIC CAMERA DEVICE

BACKGROUND

Mobile devices frequently include an imaging device such as a camera. To provide a camera with desired optical characteristics, a minimum thickness may be imposed on the optical stack of the camera. Thin mobile device form factors are also typically desired, however, which may result in a tradeoff between optical performance and device size.

SUMMARY

Examples are disclosed herein that relate to linear magnetic actuators in camera devices. One example provides a camera device comprising an optical sensor, a lens positioned a variable distance away from the optical sensor, a linear magnetic actuator having a coil and a magnet configured for linear relative movement upon driving of current, and an actuator coupling structure. The actuator coupling structure couples the linear magnetic actuator to the lens, such that the lens moves in response to the movement of the linear actuator.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

As described above, mobile devices frequently include an imaging device such as a camera. To provide a camera with desired optical characteristics, a minimum thickness may be imposed on the optical stack of the camera. Thin mobile device form factors are also typically desired, however, which may force tradeoffs between optical performance and device size. In particular, optical performance (e.g., resolution, field-of-view, spectral and spatial response) may be sacrificed to accommodate thin device form factors, and/or device size may be sacrificed (e.g., by increasing device thickness) to accommodate higher optical performance.

Figure 1A:
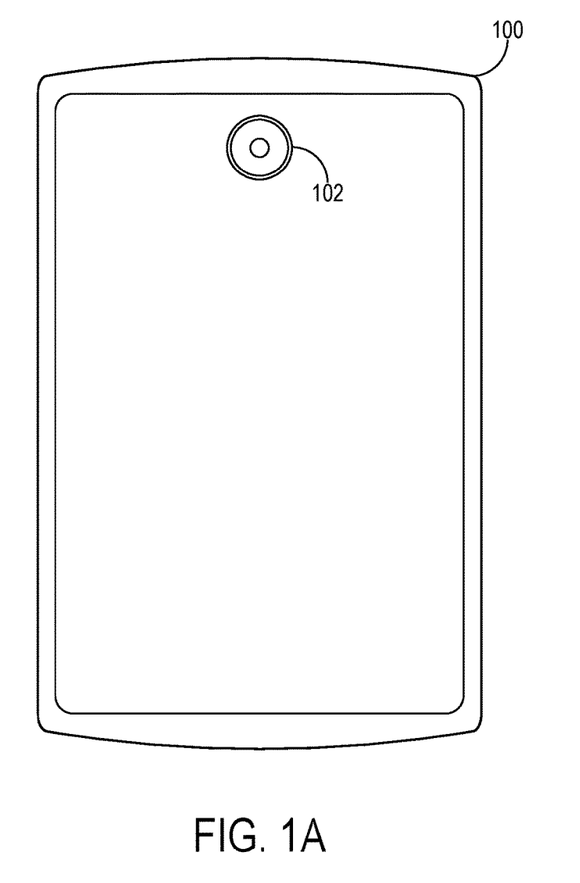
FIGS. 1A and 1B show an example mobile device including an imaging device.

FIG. 1A shows an example mobile device 100 including an imaging device 102. As shown therein, imaging device 102 may be positioned on a rear surface of mobile device 100, opposite a front (e.g., user-facing) surface of a display. Imaging device 102 may be used to capture image data in the form of images and video, which may be displayed by mobile device 100 and/or stored, transmitted, otherwise provided as output, etc.

Figure 1B:
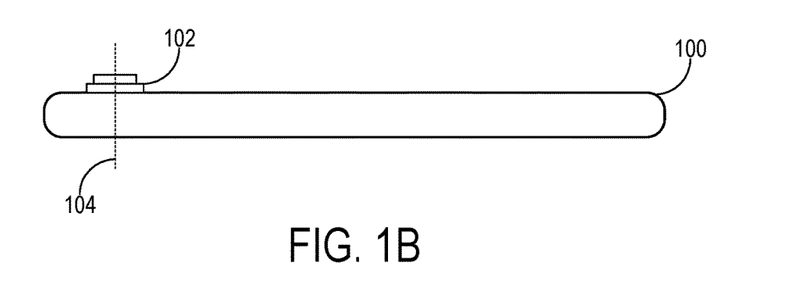

FIG. 1B shows a side view of mobile device 100. As shown therein, imaging device 102 protrudes out of the body of mobile device 100 in a direction 104—e.g., along an optical axis of the imaging device. The protrusion of imaging device 102 out of mobile device 100 may be the result of operating in the imaging device in an active state for collecting image data (e.g., in which extension of a lens is effected), with the imaging device being at least partially retracted during an inactive state. Alternatively, imaging device 102 may protrude out of the body of mobile device 100 regardless of operating state. In either case, FIG. 1B illustrates how the protrusion/thickness of imaging device 102 may be at odds with mobile device 100 having a thin form factor. As indicated above, a desirable reduction in the degree of protrusion may come at the cost of lower optical performance.

Accordingly, examples are disclosed that relate to a camera device comprising an optical sensor, a lens, a linear magnetic actuator, and an actuator coupling structure. As described in further detail below, the lens may be configured to move in response to movement of the linear actuator, thereby being positioned a variable distance away from the optical sensor. The actuator coupling structure may couple the lens to the linear magnetic actuator, which may have a coil and a magnet configured for linear relative movement upon driving of current.

Figure 2A:
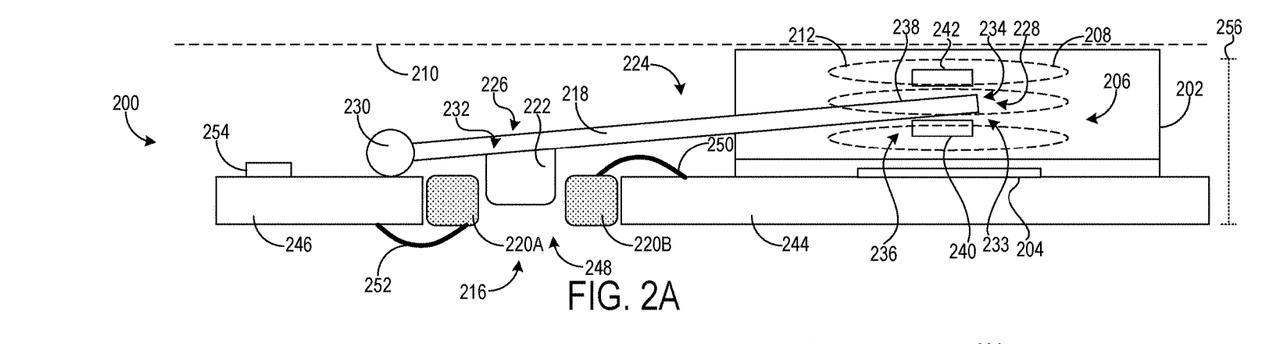
FIGS. 2A and 2B show a cross-section of an example camera device in a retracted and an extended state, respectively.
Figure 2B:
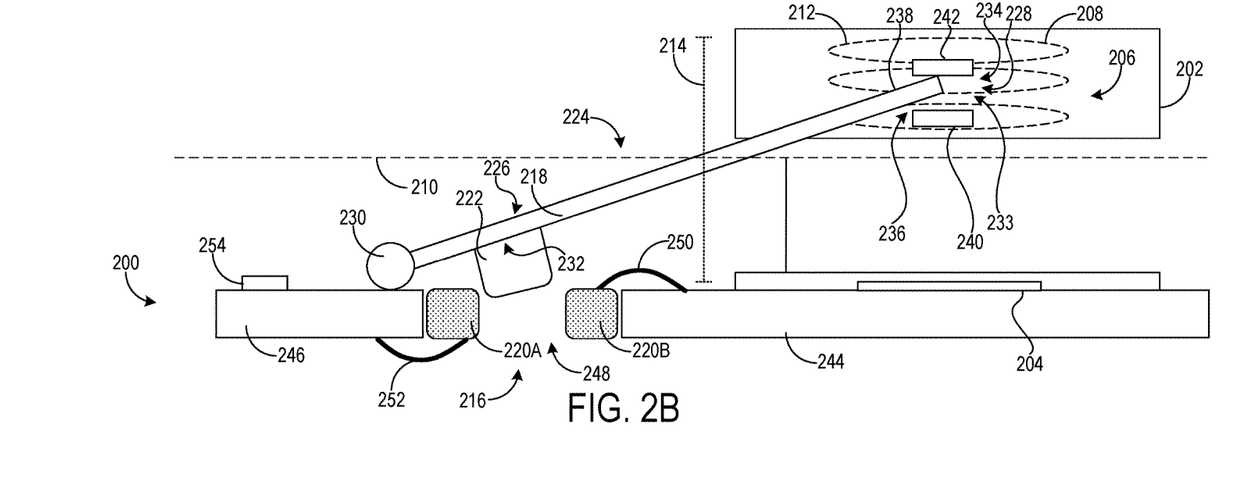

FIGS. 2A and 2B show a cross-section of an example camera device 200 in a retracted and an extended state, respectively. Camera device 200 employs electromagnetic actuation to variably position a lens housing 202 relative to an optical sensor 204. Lens housing 202 may include various optical components such as a lens assembly 206 comprising at least one lens 208. By actuating lens housing 202, the lens housing can be retracted into a camera housing 210 when operation in an inactive state is desired. As an outer surface 212 of lens 208 may be flush or recessed relative to camera housing 210 in the retracted position, protrusion out of the camera housing can be avoided, supporting thin form factors of camera device 200 and/or other devices such as a mobile device when the camera device is implemented therein. On the other hand, actuation of lens housing 202 allows the housing and optical components therein to be extended from camera housing 210 when operation in an active state (e.g., for collecting image data) is desired. The degree of extension from camera housing 210 may be variable such that lens 208 can be positioned a variable distance 214 away from optical sensor 204 as shown in FIG. 2B. In this way, lens 208 may be positioned a desired distance way from optical sensor 204 to facilitate desired optical operation—e.g., to provide the collection of high-quality image data by placing the lens at a desired focal length.

Lens assembly 206 may comprise various suitable optical components. FIGS. 2A and 2B depict, via the optional inclusion of three lenses, how any suitable number of lenses may be included in lens assembly 206. The lenses, including lens 208, may assume any suitable form (e.g., converging, diverging, catadioptric). Further, other types of optical components may be included in lens assembly 206, in lens housing 202, or in another location not depicted in FIGS. 2A and 2B, including but not limited to diffusers, filters, polarizers, etc.

To enable the actuation of lens housing 202 described above, camera device 200 includes a linear magnetic actuator 216 that generates electromagnetic force. The electromagnetic force may be imparted to lens housing 202 via a lever 218 as described in further detail below. Actuator 216 includes a coil 220 and a magnet 222, which is configured for linear relative movement upon driving of current. More specifically, a magnetic field generated by passing current through coil 220 may interact with a magnetic field generated by magnet 222 to produce upward force that can be imparted to lens housing 202 via lever 218. Magnet 222 may thus comprise one or more ferromagnetic materials (e.g., iron, cobalt, nickel, various alloys). In one example, magnet 222 may be configured for upward movement by orienting its south pole above its north pole, and by passing current through coil 220 in a direction where the current passes into a rightward portion 220A and out of a leftward portion 220B as observed in FIGS. 2A and 2B. In the retracted position illustrated in FIG. 2A, magnet 222 may be oriented such that the middle of the magnet between its poles is positioned lower than a top of coil 220—e.g., such that the lower end of its lower (e.g., north) pole is approximately aligned to the midpoint of the coil. When actuator 216 is deployed (e.g., in the state represented by FIG. 2B), an upper (e.g., south) pole of magnet 222 may be positioned proximate or above the top of coil 220.

Aspects of linear magnetic actuator 216 may be configured in view of various desired qualities of camera device 200. For example, actuator 216 may be biased in a closed position (e.g., corresponding to the retracted position illustrated in FIG. 2A). To this end, magnet 222, or another suitable element such as a spring, may be used to generate bias force for maintaining the closed position. Further, actuator 216 may be configured such that a relatively weaker magnetic force acts on magnet 222 when the magnet is in a deployed configuration (e.g., in which lens housing 202 is extended as shown in FIG. 2A) than when the magnet is in the retracted configuration. This configuration may arise from the reduced proximity of magnetic field lines produced by coil 220 when driven to magnet 222 in the retracted configuration. In this way, minimal power and force may be required to overcome friction for maintaining camera device 200 in the deployed configuration.

Linear magnetic actuator 216 may be endowed with other frictional characteristics. In particular, actuator 216 may be configured to exhibit a substantially constant friction through a full range of motion (e.g., the extent of possible motion by magnet 222, lever 218, lens housing 202). In this configuration, motion of actuator 216 can be easily ceased using substantially the same current through coil 220 throughout the entire range of actuator motion, facilitating camera adjustment in a simple manner. Alternatively, actuator 216 may be configured to exhibit relatively less friction in a middle range of deployment than in both an extended range of deployment and in a retracted range of deployment. The middle range of deployment may correspond to intermediate angles (e.g., as measured from the plane of optical sensor 204) of lever 218, for example. This configuration may aid in rapidly transitioning between deployed and retracted states, while allowing easy cessation of actuator motion in the extended and retracted ranges of deployment.

To enable movement of lens 208 (and lens assembly 206 and housing 202) responsive to movement of linear magnetic actuator 216, camera device 200 includes an actuator coupling structure 224 coupling the actuator to the lens. Structure 224 includes lever 218, which is configured with a first portion 226 that contacts and is driven by actuator 216, and a second portion 228 that connects to lens housing 202. Lever 218 amplifies motion received at first portion 226 and outputs the amplified motion at second portion 228. To this end, lever 218 may include a hinge 230 about which the lever can rotate, with magnet 222 positioned at a first location 232 on the lever and a lens coupling structure 233 positioned at a second location 234 on the lever. Upward force applied to magnet 222 by the flow of current through coil 220 may thus be imparted to components within lens housing 202 using lever 218 and the rotation afforded by hinge 230. As the application of magnetic force to magnet 222 may be directed linearly upward, the magnet may be configured for linear movement even though the magnet may engage in rotational movement via coupling to lever 218. Various degrees of amplification are possible; for example, lens 208 coupled at second location 234 of lever 218 may move 1.2 to 3 times as much as magnet 222 coupled at first location 232.

In the examples depicted in FIGS. 2A and 2B, first location 232 and second location 234 are on the same side (e.g., right side) of hinge 230. Implementations are contemplated, however, in which first location 232 and second location 234 are on opposite sides of hinge 230. In this example, magnet 222 may instead actuate lever 218 to the left of hinge 230, in which case the magnet and linear magnetic actuator 216 may be configured to push the lever downwardly to effect extension of camera housing 202. Hinge 230 may thus function as a fulcrum in a see-saw-like configuration.

Lens coupling structure 233 includes a slot 236 in lens assembly 206 to enable a distal end 238 of lever 218 to slide within the slot as the lever pivots about hinge 230. As shown in FIG. 2A, distal end 238 of lever 218 may contact a lower plate 240 in lens coupling structure 233 with lens housing 202 in the retracted state. Conversely, distal end 238 may apply an upward force to an upper plate 242 in lens coupling structure 233 to effect extension of lens housing 202 and maintain such extension.

Coil 220, mentioned above, may be positioned laterally intermediate a first printed circuit board (PCB) substrate 244 and a second PCB substrate 246 in a gap 248 between the substrates. In this configuration, first and second electrical connectors 250 and 252 are mounted on opposite (e.g., lateral) sides of coil 220, which respectively connect first PCB substrate 244 and second PCB substrate 246 to the coil (e.g., the connectors connect conductive traces on the PCB substrates to the coil). In this way, power provided on first and second PCB substrates 244 and 246 may be provided to coil 220 to effect the approaches to electromechanical actuation described herein. First PCB substrate 244 may have mounted thereon optical sensor 204, and second PCB substrate 246 may have an electronic component 254 (e.g., computing component, imaging processing component, power component, or any other suitable electronic component) mounted thereon, for example. As an example illustrating dimensions in camera device 200, a distance 256 measured from outer surface 212 of lens 208 to a back of first PCB substrate 244 on which optical sensor 204 is mounted, and with lens housing 202 in the retracted position, may be between 1 and 3 mm.

In the configuration illustrated in FIGS. 2A and 2B, a simple connection between coil 220 and first and second PCB substrates 244 and 246 may be obtained. Further, various elements of camera device 200, such as coil 220 and magnet 222, may be embedded in locations toward the center of the camera device, rather than proximate its outer surface. This may support thin device form factors. Variations to the configuration of camera device 200 are possible, however. For example, the operation of coil 220 and magnet 222 may be substantially reversed such that the magnet is a fixed element powered to effect movement of the coil to in turn effect electromechanical motion. Further, first and second PCB substrates 244 and 246 may be any other type of substrates, such as printed wiring board (PWB) substrates.

Figure 3A:
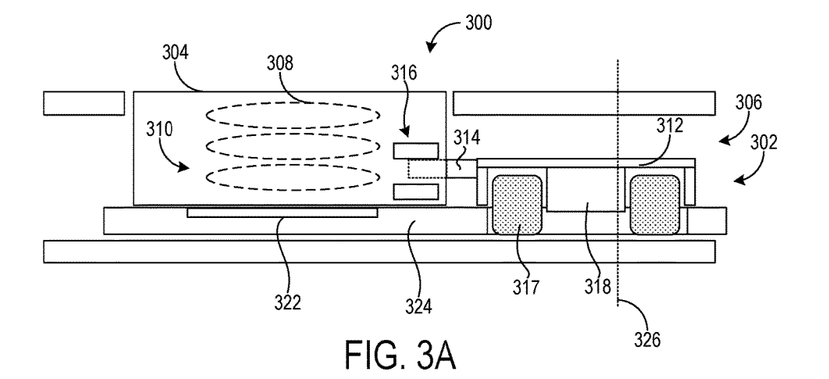
FIGS. 3A and 3B show a cross-section of another example camera device in a retracted and an extended state, respectively.
Figure 3B:
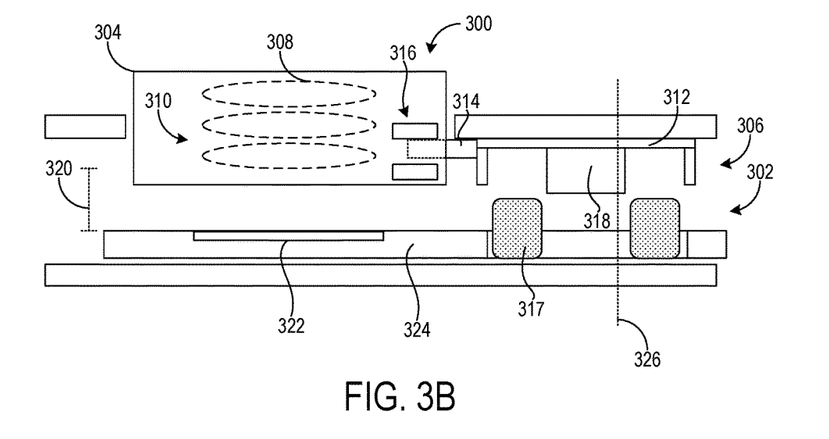

FIGS. 3A and 3B show a cross-section of an example camera device 300 in a retracted and an extended state, respectively. Aspects of camera device 300 may be similar to aspects of camera device 200 of FIG. 2. As such, similar aspects may be understood from the preceding description and are not repeated. Generally, camera device 300 employs a linear magnetic actuator 302 configured to linearly extend and retract a lens housing 304, without employing a lever arm, hinge, or corresponding rotational motion.

An actuator coupling structure 306 may couple linear magnetic actuator 302 to a lens 308 of a lens assembly 310 in lens housing 304. To this end, actuator coupling structure 306 includes a yoke 312 and a connector arm 314. Connector arm 314 couples to a lens coupling structure 316, which in turn couples to lens assembly 310 in which lens 308 is mounted. A coil 317 may be driven with current to impart force to a magnet 318 to thereby position lens assembly 310 a variable distance 320 from an image sensor 322, which is shown as being embedded on a PCB substrate 324. Actuator 302 may undergo linear motion substantially aligned to an axis 326, which may be a vertical axis, for example.

Figure 4A:
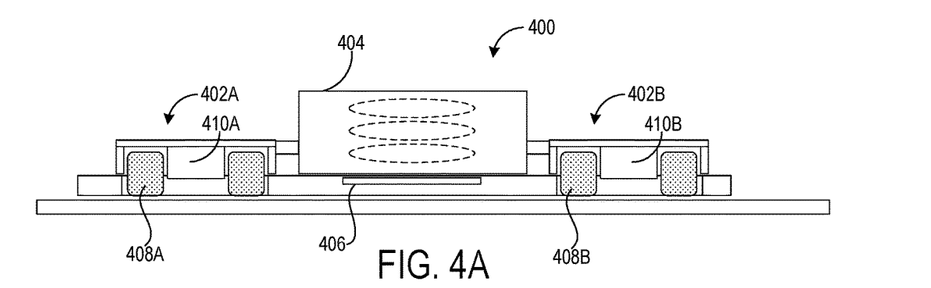
FIGS. 4A-C respectively show cross-sections of an example camera device in retracted, extended, and tilted states.
Figure 4B:
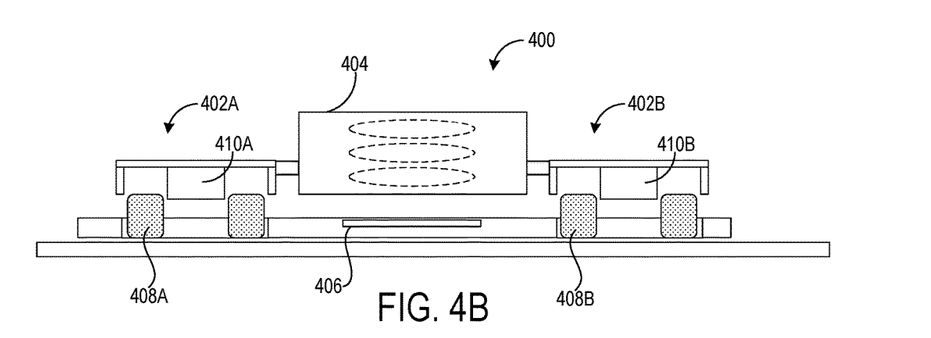
Figure 4C:
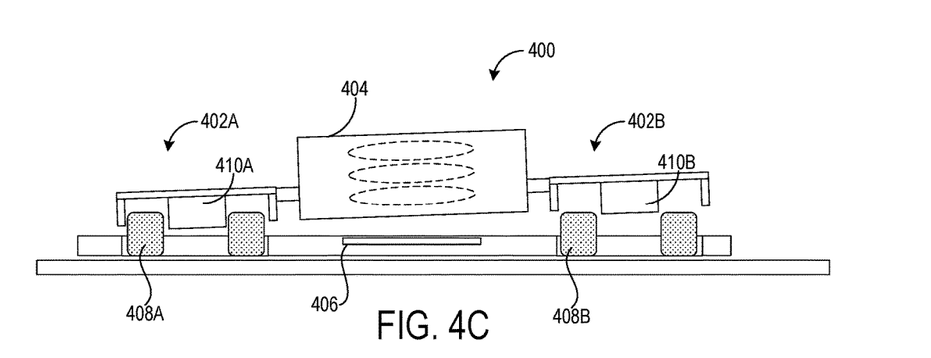

Two or more non-rotating linear magnetic actuators of the type illustrated in FIGS. 3A and 3B may be implemented in a camera device. FIGS. 4A-C respectively show cross-sections of an example camera device 400 in retracted, extended, and tilted states. In this example, camera device 400 includes two linear magnetic actuators 402A and 402B arranged laterally around a lens housing 404 to variably change the distance between optical components therein and an optical sensor 406. Actuators 402A and 402B include respective coils 408A and 408B, and respective magnets 410A and 410B configured for linear relative movement upon driving of current. FIG. 4C particularly illustrates how lens housing 404 can be variably angled relative to optical sensor 406 by creating imbalance between coils 408A and 408B. Angling lens housing 404 in this manner may be performed to correct system inaccuracies (e.g., tilt error between optics in lens housing 404 and optical sensor 406) or to facilitate optical image stabilization via lens tilt.

Figure 5:
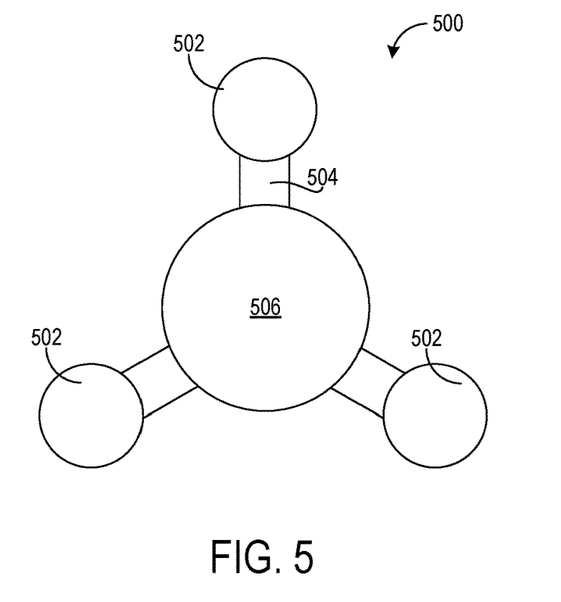
FIG. 5 shows an example camera device in which three linear magnetic actuators are arranged peripherally around a central yoke.
Figure 6:
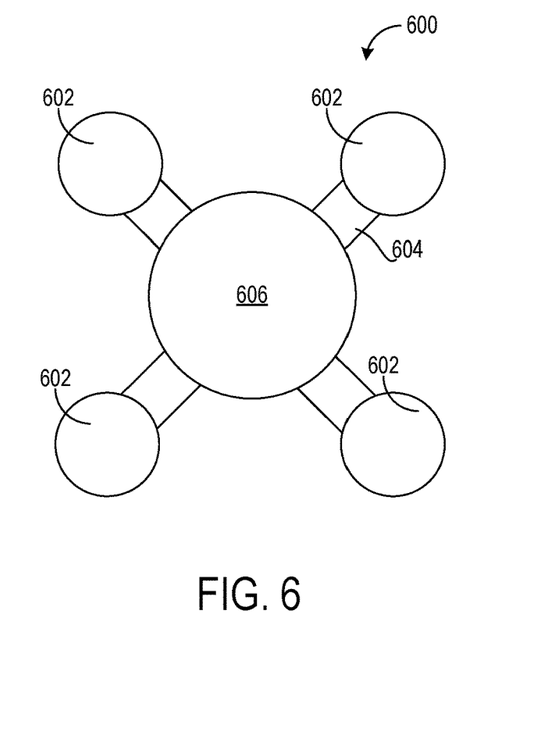
FIG. 6 shows a camera device in which four linear magnetic actuators are arranged peripherally around a central yoke.

Three or more linear magnetic actuators may be employed to variably position optics relative to an optical sensor and correct tilt error as described above. As an example, FIG. 5 shows a camera device 500 in which three linear magnetic actuators 502 are arranged peripherally around a central yoke 504 and configured to compensate for tilt in an optical assembly 506. In this example, each actuator 502 is separated from an adjacent actuator by an angle of 120°. As another example, FIG. 6 shows a camera device 600 in which four linear magnetic actuators 602 are arranged peripherally around a central yoke 604 and configured to compensate for tilt in an optical assembly 606. Each actuator 602 is separated from an adjacent actuator by an angle of 45°. Optical assemblies 506 and 606 may include one or more lenses, image sensors, and/or any other suitable optical components. Camera devices 500 and 600 may be used to provide image stabilization in two axes, for example. While specific angles and actuator numbers are illustrated in FIGS. 5 and 6, any suitable angles (including unequal angles between actuators) and number of actuators are possible.

Alternatively or in addition to the variable positioning of optics relative to optical sensors, the linear magnetic actuators described herein may be used for other purposes, including but not limited to implementing autofocus.

The following paragraphs provide additional support for the claims of the subject application. One aspect provides a camera device comprising an optical sensor, a lens positioned a variable distance away from the optical sensor, a linear magnetic actuator having a coil and a magnet configured for linear relative movement upon driving of current, and an actuator coupling structure coupling the linear magnetic actuator to the lens, such that the lens moves in response to the movement of the linear actuator. In this aspect, the actuator coupling structure alternatively or additionally may include at least one lever configured with a first portion that contacts and is driven by the linear actuator, and a second portion that connects to a lens housing, the lever amplifying motion received at the first portion and outputting the amplified motion at the second portion. In this aspect, the lever alternatively or additionally may include a hinge and a lens coupling structure positioned at a second location on the lever, wherein the magnet is positioned at a first location on the lever and driven by the linear magnetic actuator. In this aspect, the first location and second location alternatively or additionally may be on the same side of the hinge. In this aspect, the first location and second location alternatively or additionally may be on the opposite sides of the hinge. In this aspect, the lever alternatively or additionally may amplify a throw of the linear magnetic actuator, such that the lens coupled at the second location of the lever moves 1.2 to 3 times as much as the magnet coupled at the first location of the lever. In this aspect, the lens coupling structure alternatively or additionally may include a slot on a lens assembly within which the lens is mounted, and a distal end of the lever alternatively or additionally may be configured to slide within the slot as the lever pivots about the hinge. In this aspect, the camera alternatively or additionally may comprise a first printed circuit board substrate having an optical sensor mounted thereon, and a second printed circuit board substrate having an electronic component mounted thereon, wherein the coil is positioned laterally intermediate the first and second printed circuit board substrates in a gap therebetween, and wherein corresponding electrical connectors are mounted on opposite sides of the coil, the electrical connectors respectively connecting the first printed circuit board and the second printed circuit board to the coil. In this aspect, an outer surface of the lens alternatively or additionally may be flush or recessed relative to a camera housing in a retracted position. In this aspect, a distance from an outer surface of the lens to a back of a printed circuit board on which an optical sensor is mounted when in the retracted position alternatively or additionally may be between 1 and 3 mm. In this aspect, the actuator coupling structure alternatively or additionally may include a yoke and a connector arm, the connector arm coupling to a lens coupling structure, which couples to a lens assembly in which the lens is mounted. In this aspect, the linear magnetic actuator alternatively or additionally may be one of a plurality of linear magnetic actuators, each having a respective coil and magnet configured for linear relative movement upon driving of current. In this aspect, the linear magnetic actuator alternatively or additionally may be one of at least three linear magnetic actuators, arranged peripherally around a central yoke, configured to compensate for tilt. In this aspect, the linear magnetic actuator alternatively or additionally may be biased closed. In this aspect, the linear magnetic actuator alternatively or additionally may be configured to have weaker magnetic force acting on the magnet when the magnet is in the deployed configuration than when the magnet is in the retracted configuration. In this aspect, the linear magnetic actuator alternatively or additionally may be configured to exhibit a constant friction throughout a full range of motion. In this aspect, the linear magnetic actuator alternatively or additionally may be configured to exhibit less friction in a middle range of deployment than in both an extended range of deployment and in a retracted range of deployment. In this aspect, when the linear magnetic actuator is deployed, an upper pole of the magnet alternatively or additionally may be positioned above a top of a coil of the linear magnetic actuator, and when the linear magnetic actuator is retracted, a middle of the magnet between the poles of the magnet alternatively or additionally may be positioned lower than a top of the coil.

Another aspect provides a camera device comprising an optical sensor, a lens positioned a variable distance away from the optical sensor, a linear magnetic actuator having a coil and a magnet configured for linear relative movement upon driving of current, and an actuator coupling structure coupling the linear magnetic actuator to the lens, the actuator coupling structure having a lever rotatably coupled to a hinge, such that the lens moves in response to rotation of the lever.

Another aspect provides a camera device comprising an optical sensor, a lens positioned a variable distance away from the optical sensor, a linear magnetic actuator having a coil and a magnet configured for linear relative movement about an axis upon driving of current, and an actuator coupling structure coupling the linear magnetic actuator to the lens, the actuator coupling structure having a yoke and a connector arm coupled to a lens coupling structure, such that the lens moves in response to the movement of the linear actuator about the axis.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A camera device, comprising:
   an optical sensor;
   a lens positioned a variable distance away from the optical sensor;
   a linear magnetic actuator having a coil defining a gap between opposing portions of the coil and a magnet configured for linear movement which occurs within the gap upon driving of current; and
   an actuator coupling structure coupling the linear magnetic actuator to the lens, such that the lens moves in response to the movement of the linear magnetic actuator, wherein the lens is spaced from the magnet.

2. The camera device of claim 1, wherein the actuator coupling structure includes at least one lever configured with a first portion that contacts and is driven by the linear magnetic actuator, and a second portion that connects to a lens housing, the lever amplifying motion received at the first portion and outputting the amplified motion at the second portion.

3. The camera device of claim 2, wherein the lever includes
   a hinge; and
   a lens coupling structure positioned at a second location on the lever;
   wherein the magnet is positioned at a first location on the lever and driven by the linear magnetic actuator.

4. The camera device of claim 3, wherein the first location and second location are on the same side of the hinge.

5. The camera device of claim 3, wherein the first location and second location are on the opposite sides of the hinge.

6. The camera device of claim 3, wherein the lever amplifies a throw of the linear magnetic actuator, such that the lens coupled at the second location of the lever moves 1.2 to 3 times as much as the magnet coupled at the first location of the lever.

7. The camera of claim 3, wherein the lens coupling structure includes a slot on a lens assembly within which the lens is mounted, and a distal end of the lever is configured to slide within the slot as the lever pivots about the hinge.

8. The camera of claim 1, further comprising:
   a first printed circuit board substrate having the optical sensor mounted thereon; and
   a second printed circuit board substrate having an electronic component mounted thereon;
   wherein the coil is positioned laterally intermediate the first and second printed circuit board substrates in the gap therebetween; and
   wherein corresponding electrical connectors are mounted on opposite sides of the coil, the electrical connectors respectively connecting the first printed circuit board and the second printed circuit board to the coil.

9. The camera device of claim 1, wherein an outer surface of the lens is flush or recessed relative to a camera housing in a retracted position.

10. The camera device of claim 1, wherein a distance from an outer surface of the lens to a back of a printed circuit board on which an optical sensor is mounted when in the retracted position is between 1 and 3 mm.

11. The camera device of claim 1, wherein the actuator coupling structure includes a yoke and a connector arm, the connector arm coupling to a lens coupling structure, which couples to a lens assembly in which the lens is mounted.

12. The camera device of claim 1, wherein the linear magnetic actuator is one of a plurality of linear magnetic actuators, each having a respective coil and magnet configured for linear relative movement upon driving of current.

13. The camera device of claim 12, wherein the linear magnetic actuator is one of at least three linear magnetic actuators, arranged peripherally around a central yoke, configured to compensate for tilt.

14. The camera device of claim 1, wherein the linear magnetic actuator is biased closed.

15. The camera device of claim 1, wherein the linear magnetic actuator is configured to have weaker magnetic force acting on the magnet when the magnet is in the deployed configuration than when the magnet is in the retracted configuration.

16. The camera device of claim 1, wherein the linear magnetic actuator is configured to exhibit a constant friction throughout a full range of motion.

17. The camera device of claim 1, wherein the linear magnetic actuator is configured to exhibit less friction in a middle range of deployment than in both an extended range of deployment and in a retracted range of deployment.

18. The camera device of claim 1, wherein
when the linear magnetic actuator is deployed, an upper pole of the magnet is positioned above a top of a coil of the linear magnetic actuator; and
when the linear magnetic actuator is retracted, a middle of the magnet between the poles of the magnet is positioned lower than a top of the coil.

19. A camera device, comprising:
an optical sensor;
a lens positioned a variable distance away from the optical sensor;
a linear magnetic actuator having a coil defining a gap between opposing portions of the coil and a magnet configured for linear movement which occurs within the gap upon driving of current; and
an actuator coupling structure coupling the linear magnetic actuator to the lens, the actuator coupling structure having a lever rotatably coupled to a hinge, such that the lens moves in response to rotation of the lever, wherein the lens is spaced from the magnet.

20. A camera device, comprising:
an optical sensor;
a lens positioned a variable distance away from the optical sensor;
a linear magnetic actuator having a coil defining a gap between opposing portions of the coil and a magnet configured for linear movement which occurs within the gap about an axis upon driving of current; and
an actuator coupling structure coupling the linear magnetic actuator to the lens, the actuator coupling structure having a yoke and a connector arm coupled to a lens coupling structure, such that the lens moves in response to the movement of the linear magnetic actuator about the axis, wherein the lens is spaced from the magnet.

* * * * *